United States Patent
May et al.

(10) Patent No.: US 7,245,247 B1
(45) Date of Patent: Jul. 17, 2007

(54) ANALOG TO DIGITAL SIGNAL CONVERTER HAVING SAMPLING CIRCUIT WITH DIVIDED INTEGRATING CAPACITANCE

(75) Inventors: Michael R. May, Austin, TX (US); Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/355,934

(22) Filed: Feb. 16, 2006

(51) Int. Cl.
  *H03M 3/00* (2006.01)
(52) U.S. Cl. .................. 341/143; 341/172; 341/122
(58) Field of Classification Search ................ 341/122, 341/173, 143, 172
  See application file for complete search history.

(56) References Cited

U.S. PATENT DOCUMENTS

| | | | |
|---|---|---|---|
| 5,500,645 A * | 3/1996 | Ribner et al. ............... 341/143 |
| 6,004,793 A * | 12/1999 | Lunnen et al. .............. 435/199 |
| 6,140,950 A * | 10/2000 | Oprescu ..................... 341/143 |
| 6,351,050 B1 * | 2/2002 | Coles .................... 310/156.53 |
| 6,473,018 B2 * | 10/2002 | Ueno et al. ................. 341/143 |
| 6,570,519 B1 * | 5/2003 | Yang ......................... 341/143 |
| 6,580,383 B1 * | 6/2003 | Devendorf et al. ......... 341/143 |
| 6,674,381 B1 * | 1/2004 | Gomez et al. .............. 341/143 |
| 6,956,514 B1 * | 10/2005 | Melanson et al. .......... 341/143 |
| 2005/0088327 A1 * | 4/2005 | Yokoyama et al. ......... 341/143 |
| 2006/0061502 A1 * | 3/2006 | Yoshioka et al. ........... 341/172 |

* cited by examiner

*Primary Examiner*—Linh V. Nguyen
(74) *Attorney, Agent, or Firm*—Garlick Harrison & Markison; Bruce E. Garlick

(57) ABSTRACT

An analog-to-digital converter (ADC) includes a modulator and a decimation filter. The modulator includes a sampling circuit, integrator, a quantizer, and feedback circuitry. The sampling circuit includes at least one sampling capacitor and a plurality of dump capacitors. A sum of the capacitance of the dump capacitors is substantially equal to a capacitance of the sampling capacitors. Combined sampling/dump capacitors having approximately equal capacitance may be used with the sampling circuit.

26 Claims, 9 Drawing Sheets

ANALOG TO DIGITAL SIGNAL CONVERTER HAVING SAMPLING CIRCUIT WITH DIVIDED INTEGRATING CAPACITANCE

BACKGROUND

1. Technical Field

This invention relates generally to analog to digital signal conversion and more particularly to a modulator for use within an analog to digital converter.

2. Description of Related Art

The formation and use of integrated circuits is generally known. Integrated circuits are found not only in electronic devices but in machinery, vehicles, aircraft, and a large number of other devices. Most of these devices require interaction with the physical world. Thus, one common circuit present in many integrated circuits is an Analog-to-Digital Converter (ADC). An ADC receives an analog input signal and converts the analog input signal into a digital signal. The integrated circuit subsequently operates upon the digital signal and may even produce an analog output using a Digital-to-Analog Converter (DAC).

ADCs must accurately convert the analog input signal into the digital signal. Such is the case because the overall performance of the integrated circuit is based upon the accuracy with which the analog input signal is measured. Because ADCs include circuit elements formed in semiconductor manufacturing processes having process variations, ADC circuit components having component values that vary from integrated circuit to integrated circuit. Mismatches in ADC circuit components cause the ADC to improperly function and cause the ADC to inaccurately convert the analog input signal to the digital signal. Thus, a need exists for an ADC that overcomes mismatches in its circuit components.

DETAILED DESCRIPTION OF THE DRAWINGS

Figure 1:
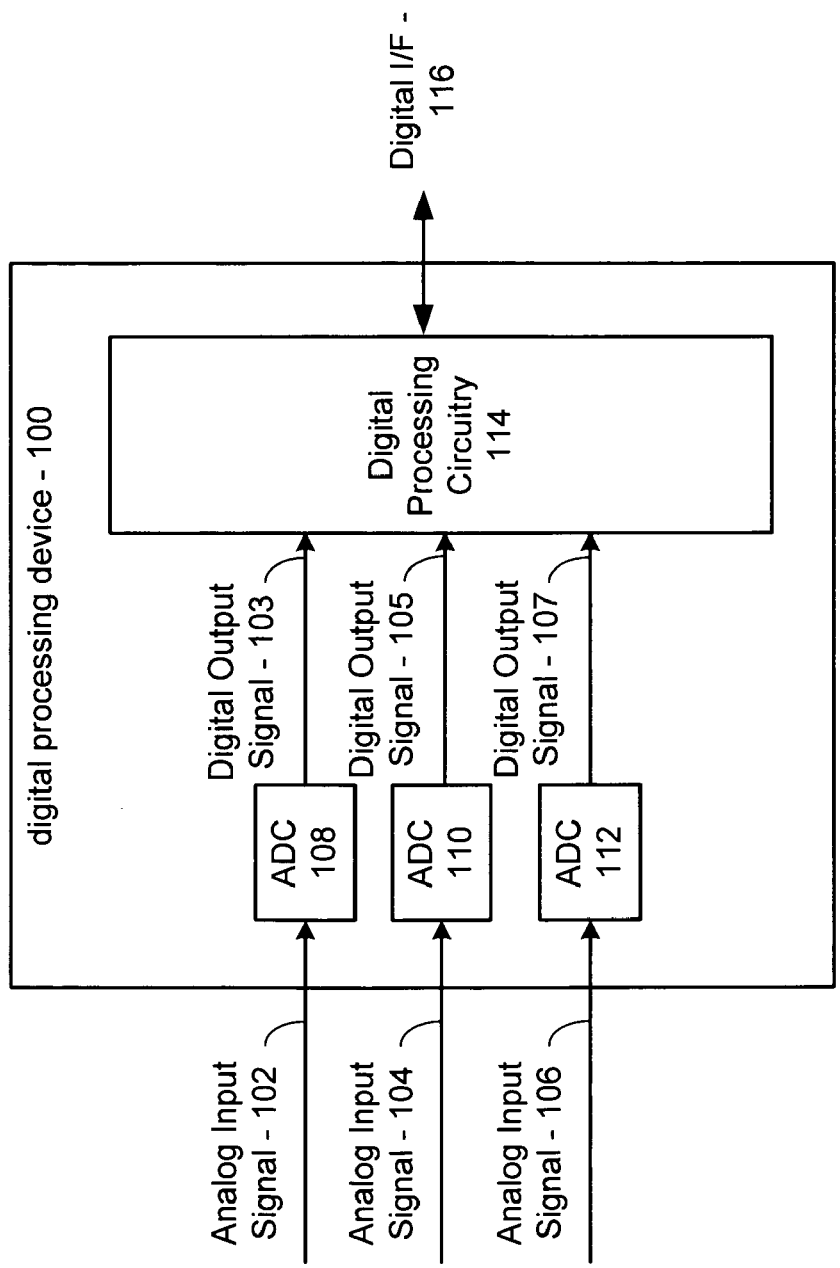
FIG. 1 is a block diagram illustrating a digital processing device that includes an Analog-to-Digital Converter (ADC) constructed and operating according to an embodiment of the present invention.

FIG. 1 is a block diagram illustrating a digital processing device that includes an Analog-to-Digital Converter (ADC) constructed and operating according to an embodiment of the present invention. The digital processing device 100 includes ADC's 108, 110, and 112 and digital processing circuitry 114, at least one of which is constructed and operates according to the present invention. ADC 108 receives an analog input signal 102 and produces a digital output signal 103 that is operated upon by the digital processing circuitry 114. ADC 110 receives an analog input signal 104 and produces digital output signal 105 that is also operated upon by the digital processing circuitry 114. ADC 112 receives an analog input signal 106 and produces digital output signal 107 that is also operated upon by the digital processing circuitry 114. The digital processing circuitry 114 includes a digital interface 116 that interfaces the digital processing device 100 to other components coupled thereto.

The digital processing device 100 may be present in a portable handheld device such as an audio playback device, a cellular telephone, a communication interface device, a computer system, for example. The digital processing device 100 may be present within a larger device such as an automobile, an appliance, an airplane, or another such device. Thus, the analog input signal 102 may be an FM continuous time input signal, a microphone input signal, a sensor input, a battery voltage input, or another analog input signal. The ADC of the present invention may be present in any device requiring the ADC function. The digital processing circuitry 114 operates upon the digital output signals 103, 105, and/or 107 as part of its processing duties. Of course, in some embodiments of the digital processing device 100, only a single ADC is present. The ADC of the present invention may be formed separately from the digital processing circuitry 114 or upon a single die.

Figure 2:
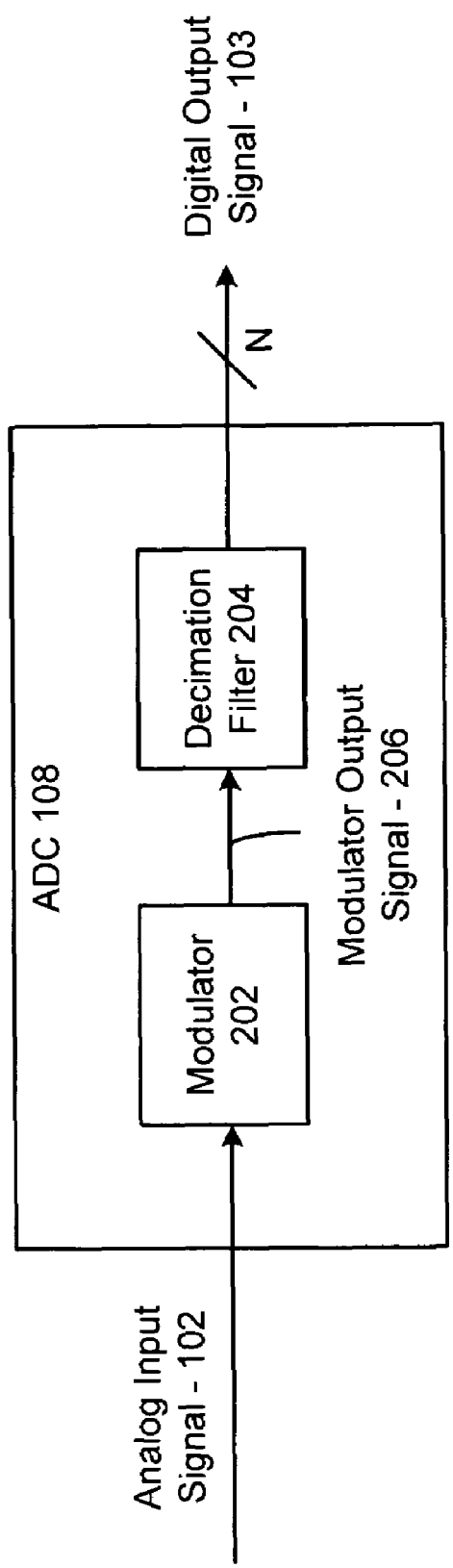
FIG. 2 is a block diagram illustrating an ADC constructed and operating according to an embodiment of the present invention.

FIG. 2 is a block diagram illustrating an ADC constructed and operating according to an embodiment of the present invention. The ADC 108 receives the analog input signal 102 and produces produce a digital output signal 103. The digital output signal 103 includes a multiple bit representation (N bits) and has a sample rate. The digital output signal 103 would typically have a data width (N) that corresponds to a data width of the digital processing circuitry 114 to which it produces the digital output signal 103.

The ADC 108 includes a modulator 202 and a decimation filter 204. The modulator 202 receives the analog input signal 102 and produces a modulator output signal 206. The decimation filter 204 receives the modulator output signal 206 and produces the digital output signal 103. According to the present invention, the modulator 202 is constructed to more accurately sample the analog input signal 102 and to produce the modulator output signal 206. With the embodiment of the ADC 108 of FIG. 2, as will be described further with reference to FIGS. 3-11, the modulator 202 includes a sampling circuit that is able to overcome problems caused by mismatched components that may be produced by semiconductor process formation variations.

Figure 3:
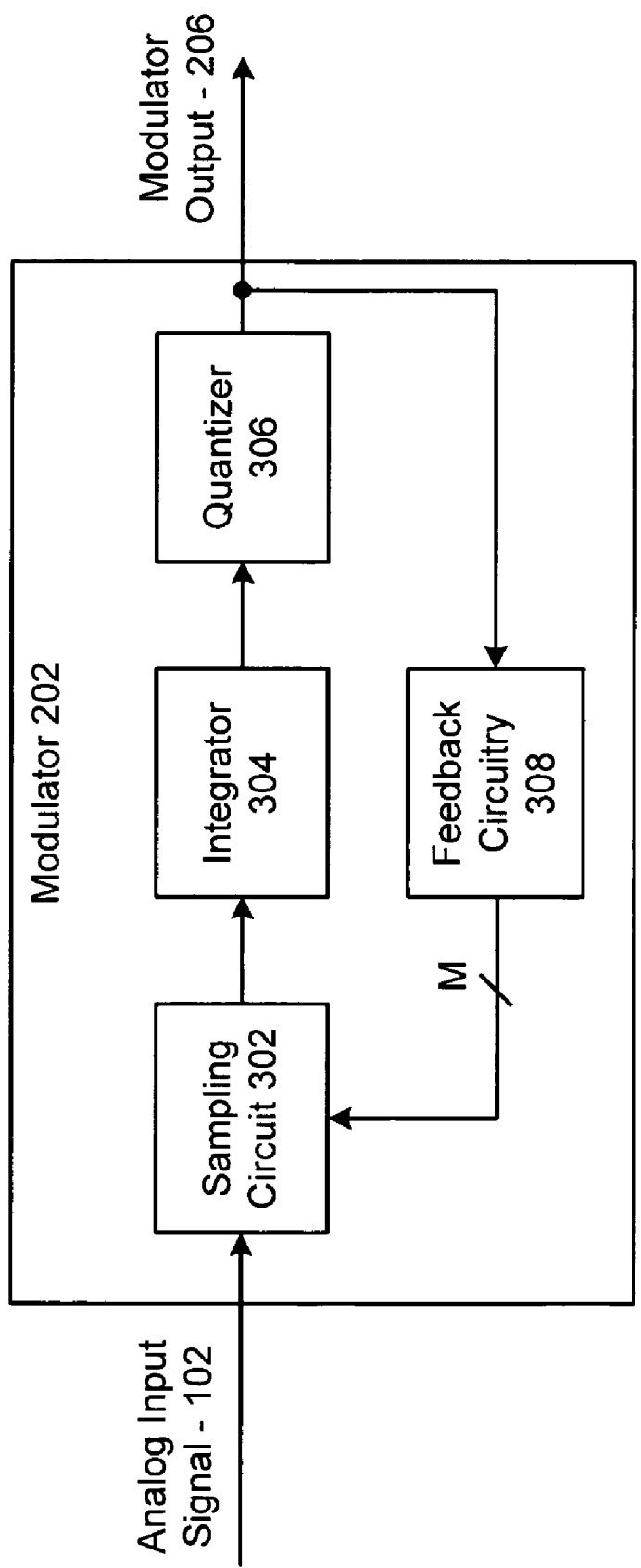
FIG. 3 is a block diagram illustrating an embodiment of modulator of an ADC constructed and operating according to an embodiment of the present invention.

FIG. 3 is a block diagram illustrating an embodiment of modulator of an ADC constructed and operating according to an embodiment of the present invention. The modulator 202 receives the analog input signal 102 and produces the modulator output 206. According to the embodiment of FIG. 3, the sampling circuit 302 includes components formed and operating according to the present invention. The sampling circuit 302 has an input that receives the analog input signal 102 and produces an output to integrator 304. The integrator 304, based upon the input received from sampling circuit 302, produces an output to quantizer 306. Quantizer 306 quantizes its input to produce the modulator output 206. The decimation filter 204 receives the modulator output, decimates and filters the modulator output 206, and produces the digital output signal 103.

The feedback circuitry 308 receives the modulator output 206 and produces a plurality of feedback signals (M feedback signals) to the sampling circuit 302. According to the present invention, the M feedback signals change over time based upon the state of the modulator output 206. Examples of structure and operation of the sampling circuit 302 are further illustrated in and described with reference to FIGS. 4, 5, 6, 8, 9, 10, and 11.

Figure 4:
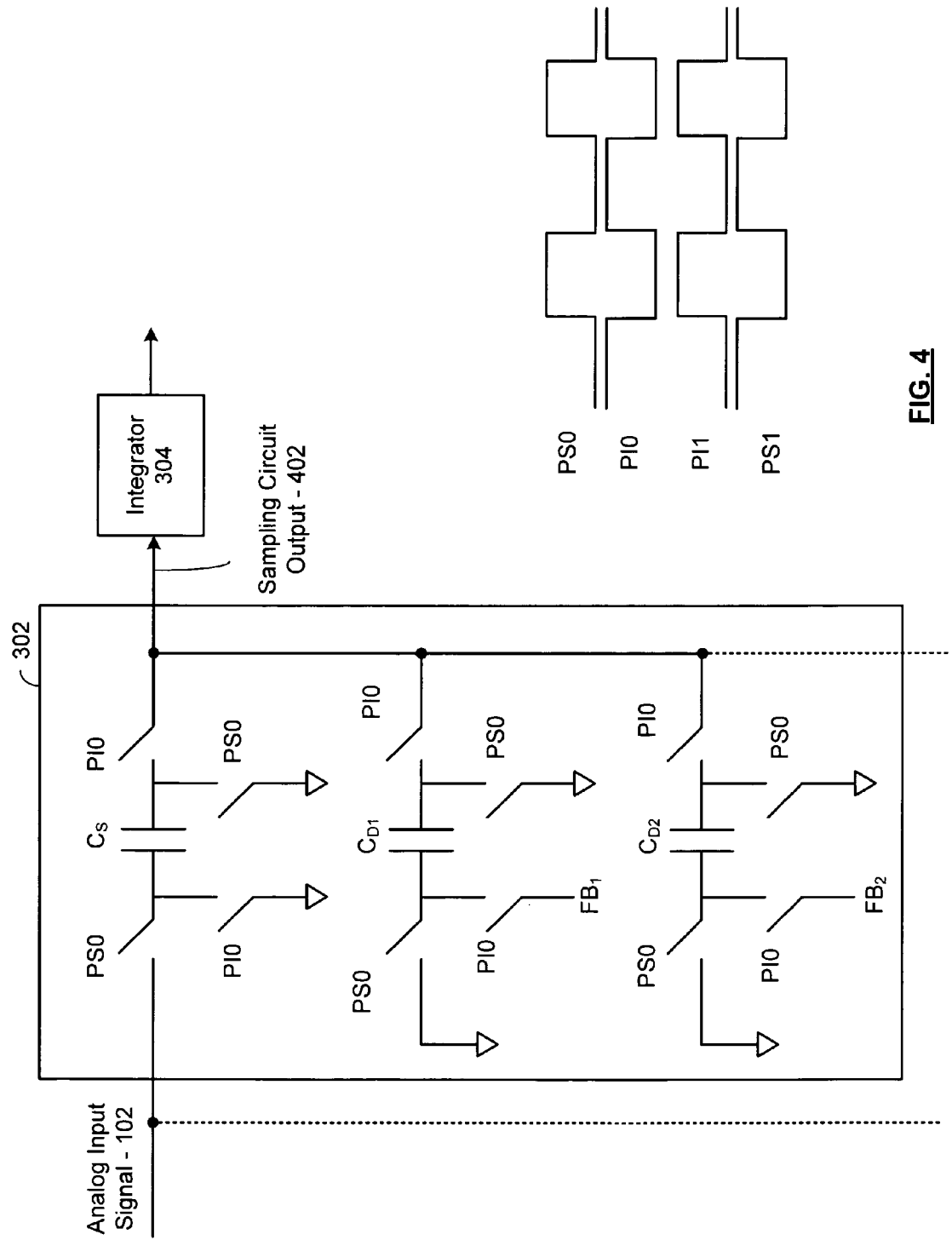
FIG. 4 is a schematic block diagram illustrating an embodiment of a sampling circuit of a modulator of an ADC constructed and operating according to an embodiment to the present invention.

FIG. 4 is a schematic block diagram illustrating an embodiment of a sampling circuit of a modulator of an ADC constructed and operating according to an embodiment to the present invention. The sampling circuit 302 includes a sampling capacitor $C_S$ and dump capacitor $C_{D1}$ and $C_{D2}$. As is shown the sampling capacitor $C_S$ is coupled to the analog input signal 102 and the integrator 304 by switches that open and close based upon complimentary non-overlapping clocks PS0 and PI0. Dump capacitors $C_{D1}$ and $C_{D2}$ are connected to AC ground or the integrator 304 by switches that open and close based upon complimentary non-overlapping clocks PS0 and PI0. Generally, when a controlling clock signal (PS0, PI0, PS1 or PI1) is high, a corresponding switch is closed and when a controlling clock signal is low, the corresponding switch is open. The input provided to the integrator 304 is referred to generally as the sampling circuit output 402. Clock signals PS0, PI0, PS1, and PI1 are shown to be four separate clock signals for clarity in describing operation of the sampling circuits of FIGS. 4-6. Note, however, that clock signal PS0 may be the same signal as clock signal as PI1 and that clock signal PI0 may be the same signal as clock signal PS1.

During a sampling interval (PS0 high) a first side of the sampling capacitor $C_S$ couples to the analog input signal 102 and a second side of sampling capacitor $C_S$ couples to AC ground. Further during the sampling interval (PS0 high) both sides of both the first dump capacitor $C_{D1}$ and the second dump capacitor $C_{D2}$ couple to AC ground.

During an integrating interval (PI0 high), a first side of the sampling capacitor $C_S$ couples to AC ground while a second side of the sampling capacitor $C_S$ couples to the integrator input 304. Further, during the integrating interval (PI0 high), a first side of the first dump capacitor $C_{D1}$ couples to a first feedback signal $FB_1$ and a second side of the first dump capacitor $C_{D1}$ couples to the integrator 304. Moreover, during the integrating interval (PI0 high), a first side of the second dump capacitor $C_{D2}$ couples to feedback signal $FB_2$ and a second side of the second dump capacitor $C_{D2}$ couples to an input of the integrator 304.

In one embodiment of the present invention, a capacitance of the sampling capacitor $C_S$ is approximately equal to a combined capacitance of the first and second dump capacitors $C_{D1}$ and $C_{D2}$. According to another aspect of the present invention, the capacitance of the dump capacitors $C_{D1}$ and $C_{D2}$ are approximately equal, even though a sum of their capacitance may not be substantially equal to $C_S$. According to other embodiments of the present invention, the sampling circuit 402 includes more than two dump capacitors.

Referring again to FIG. 3, integrator 304 integrates the sampling circuit output to produce an integrated output. Quantizer 306 receives the output of integrator 304 and quantizes the output of integrator 304 to produce the modulator output 206. Feedback circuitry 308 produces both the first feedback signal and the second feedback signal based upon modulator output 206. Referring again to FIG. 2, the decimation filter 204 decimates and filters the modulator output signal 206 to produce the digital output signal 103.

Referring to all of FIGS. 2-4, in one embodiment, the quantizer 306 is operable to produce a single bit output. Further, the feedback circuitry 308 may be operable to produce the first feedback signal as a current output of the quantizer and to produce the second feedback signal as a prior output of the quantizer. The structure of feedback circuitry 308 according to various embodiments will be described further with reference to FIGS. 8 and 9.

Figure 5:
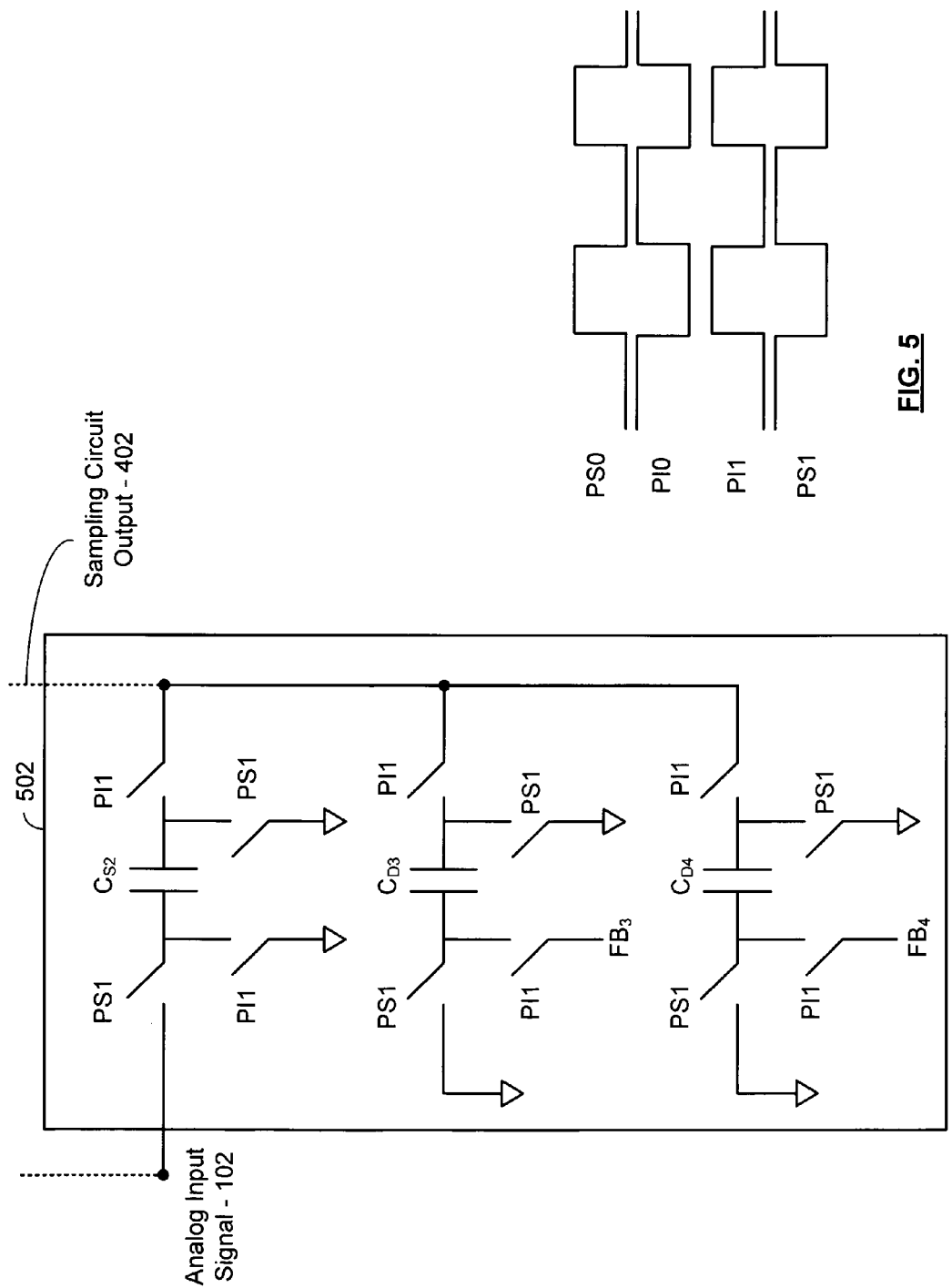
FIG. 5 is a schematic block diagram illustrating additional components of a sampling circuit constructed and operating according to an embodiment of the present invention.

FIG. 5 is a schematic block diagram illustrating additional components of a sampling circuit constructed and operating according to an embodiment of the present invention. Sampling circuit 502 works in conjunction with sampling circuit 302 of FIG. 4 to, in combination, form a correlated double sampling circuit. The reader will appreciate that the components of the sampling circuit 502 of FIG. 5 are similar to those of the sampling circuit 302 of FIG. 4 but operate in a complimentary fashion to the components of sampling circuit 302 of FIG. 4. A second sampling interval (PS1 high) and a second integrating interval (PI1 high) of sampling circuit 502 generally correspond to integrating interval (PI0 high) and sampling interval (PS0 high) of sampling circuit 302, respectively. The second sampling circuit includes a second sampling capacitor $C_{S2}$ and two dump capacitors $C_{D3}$ and $C_{D4}$. In one embodiment of the invention the sum of the capacitance of the third dump capacitor $C_{D3}$ and the fourth dump capacitor $C_{D4}$ is approximately equal to the capacitance of the second sampling capacitor $C_{S2}$. Further, the capacitance of the third dump capacitor $C_{D3}$ may be approximately equal to the capacitance of the fourth dump capacitor $C_{D4}$, even though a sum of the capacitance of the third dump capacitor $C_{D3}$ and the fourth dump capacitor $C_{D4}$ may not be substantially equal to the capacitance of the second sampling capacitor $C_{S2}$.

During the second sampling interval (PS1 high), a first side of second sampling capacitor $C_{S2}$ couples to the analog input signal 102 while a second side of the second sampling capacitor $C_{S2}$ couples to AC ground. Further, during the second sampling interval (PS1 high), both first and second sides of both a third dump capacitor $C_{D3}$ and a fourth dump capacitor $C_{D4}$ couple to AC ground.

During the second integrating interval (PI1 high), the first side of the second sampling capacitor $C_{S2}$ couples to AC ground while the second side of the second sampling capacitor $C_{S2}$ couples to the input of integrator 304. Further, during the second integrating interval (PI1 high), a first side of the third dump capacitor $C_{D3}$ couples to a third feedback signal $FB_3$ while a second side of the third dump capacitor $C_{D3}$ couples to an input of integrator 304. Moreover, during the second integrating interval (PI1 high), a first side of the fourth dump capacitor $C_{D4}$ couples to a fourth feedback signal $FB_4$ while a second side of the fourth dump capacitor $C_{D4}$ couples to an input of integrator 304.

Figure 6:
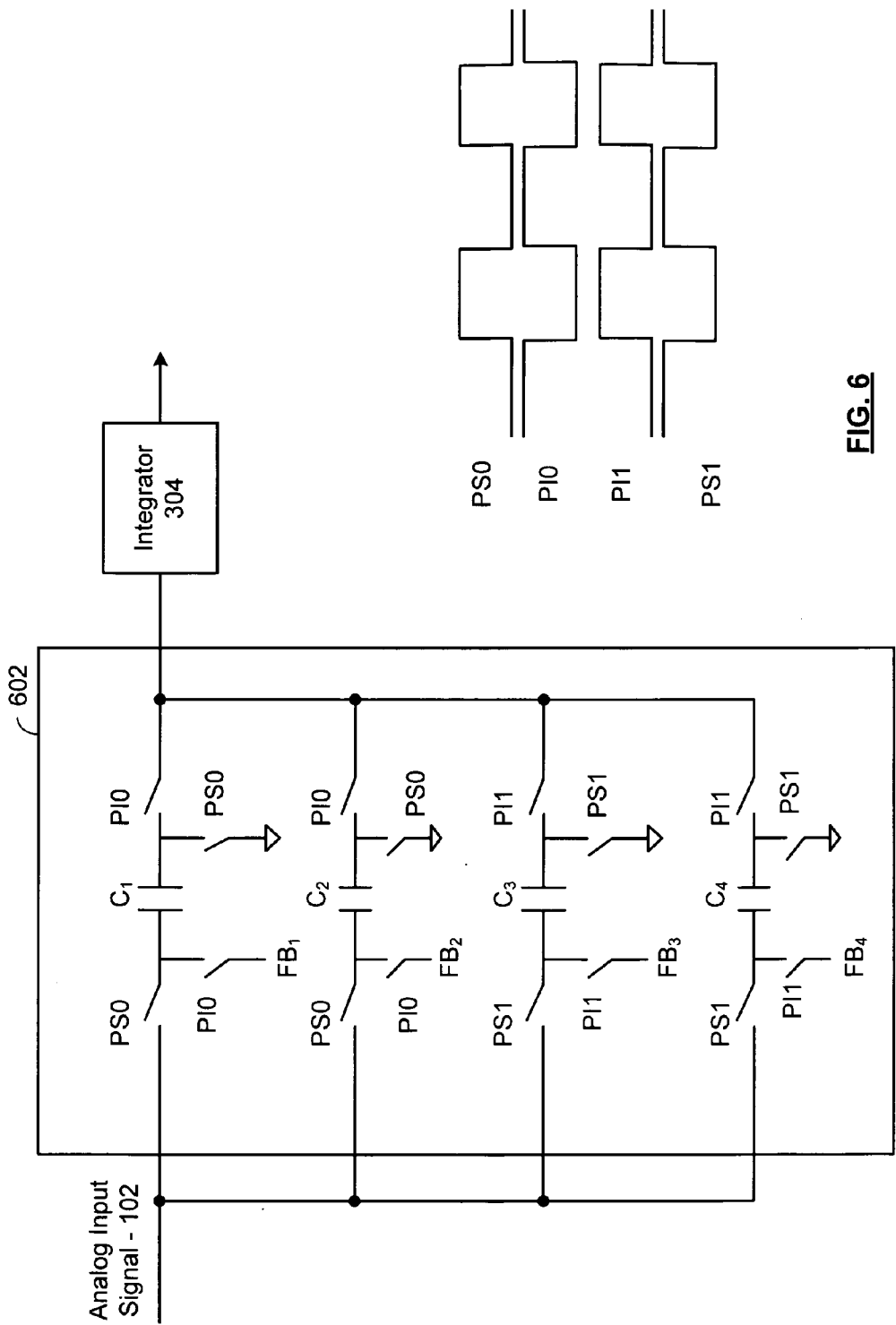
FIG. 6 is a schematic block diagram illustrating a sampling circuit constructed according to another embodiment of the present invention.

FIG. 6 is a schematic block diagram illustrating a sampling circuit constructed according to another embodiment of the present invention. As is shown the sampling circuit 602 includes a first capacitor $C_1$, a second capacitor $C_2$, a third capacitor $C_3$, and a fourth capacitor $C_4$. In another embodiment of the sampling circuit 602 of FIG. 6, the sampling circuit 602 only includes capacitors $C_1$ and $C_2$. However, with the structure of FIG. 6 illustrated, the four capacitors form a correlated double sampling circuit.

The sampling circuit 602 operates in conjunction with correlated non-overlapping clock signals PS0, PI0, PS1, and PI1. During a first sampling interval (PS0 high), the first sides of capacitors $C_1$ and $C_2$ couple to analog input signal 102 while second sides of capacitors $C_1$ and $C_2$ couple to AC ground. During a first integrating interval (PI0 high), a first side of capacitor $C_1$ couples to first feedback signal $FB_1$ and a second side of capacitor $C_1$ couples to the input of integrator 304. Further, during the first integrating interval (PI0 high), a first side of capacitor $C_2$ couples to a second feedback signal $FB_2$ while a second side of capacitor $C_2$ couples to the input of integrator 304.

During a second sampling interval (PS1 high), a first side of capacitor $C_3$ couples to analog input signal 102 while a second side of capacitor $C_3$ couples to AC ground. Further, during the second sampling interval (PS1 high), a first side of capacitor $C_4$ couples to the analog input signal 102 while a second side of capacitor $C_4$ couples to AC ground. During a second integrating interval (PI1 high), a first side of capacitor $C_3$ couples to a third feedback signal $FB_3$ while a second side of capacitor $C_3$ couples to the input of integrator 304. Finally; during the second integrating interval (PI1 high), a first side of capacitor $C_4$ couples to the fourth feedback signal $FB_4$ while a second side of capacitor $C_4$ couples to an input of integrated 304.

The switches that control connectivity of the feedback signals, FBx to the respective components of the switching circuits 302, 502, and 602 of FIGS. 4-6 may be each implemented as two switches that are connected to fixed feedback voltages. With this construct, these switches would be driven by a respective clock signal coupled in an AND relationship with a respective FBx signal.

Figure 7:
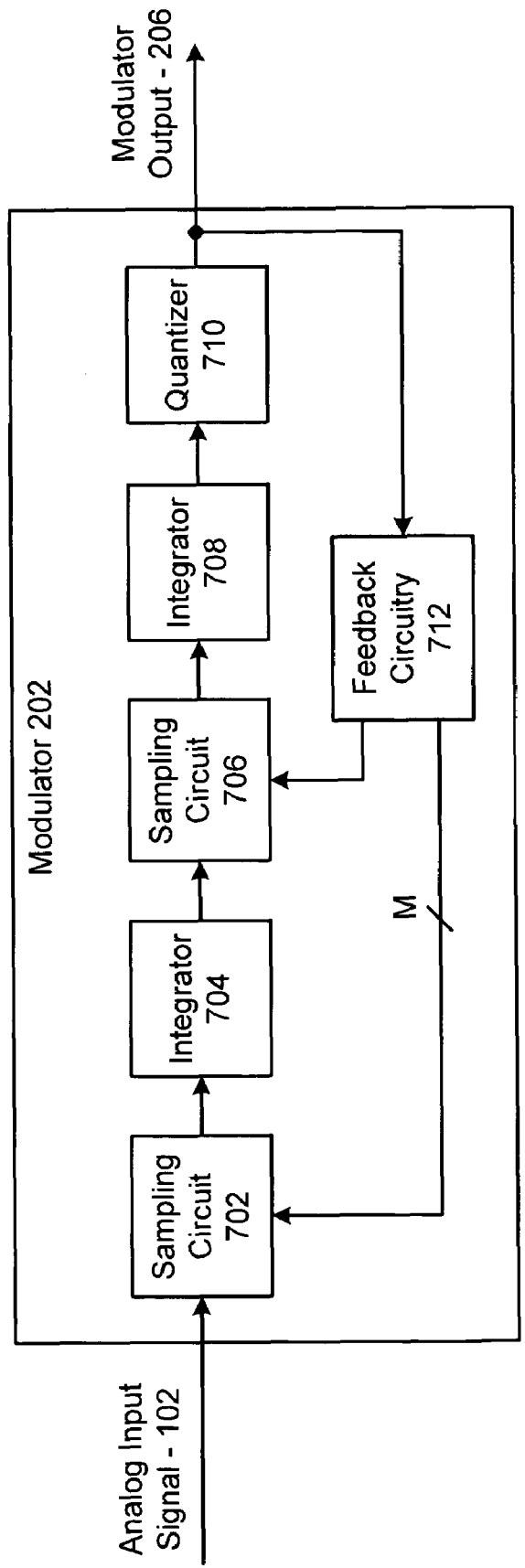
FIG. 7 is a block diagram illustrating a modulator of an ADC constructed and operating according to another embodiment of the present invention.

FIG. 7 is a block diagram illustrating a modulator of an ADC constructed and operating according to another embodiment of the present invention. Modulator 202 receives analog input signal 102 and produces modulator output 206. Modulator 202 includes sampling circuit 702, integrator 704, sampling circuit 706, integrator 708, quantizer 710, and feedback circuitry 712. With the embodiment of the modulator 202 of FIG. 7, the modulator 202 includes multiple sampling circuits and multiple integrators. Each of the sampling circuits 702 and 706 may include a structure similar to or same as the structure illustrated in FIGS. 4, 5, and 6. However, in another embodiment, the sampling circuits 702 and 706 may have differing structure. The reader may appreciate that the accuracy of sampling circuit 702 is more important than the accuracy of sampling circuit 706 in some applications. Thus, circuitry of sampling circuit 702 may include structure same or similar to that illustrated in FIGS. 4-6 while sampling circuit 706 may include simpler structure.

Figure 8:
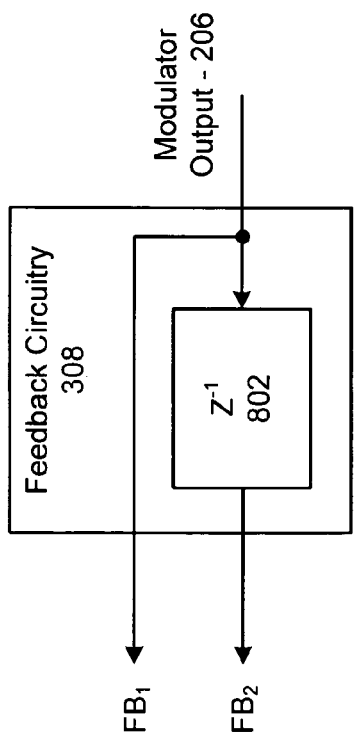
FIG. 8 is a block diagram illustrating feedback circuitry of an ADC constructed according to an embodiment of the present invention.

FIG. 8 is a block diagram illustrating feedback circuitry of an ADC constructed according to an embodiment of the present invention. The feedback circuitry 308 receives the modulator output 206 and includes a delay element 802. With the embodiment of the feedback circuitry 308 of FIG. 8, the first feedback signal $FB_1$ is simply the modulator output 206 while the second feedback signal $FB_2$ is a delayed representation of modulator output 206. In such case, the delay element 802 introduces one operating cycle of delay. This operating cycle would typically be based upon a frequency of the complimentary non-overlapping clocks PS0, PI0, PS1, and PI1.

Figure 9:
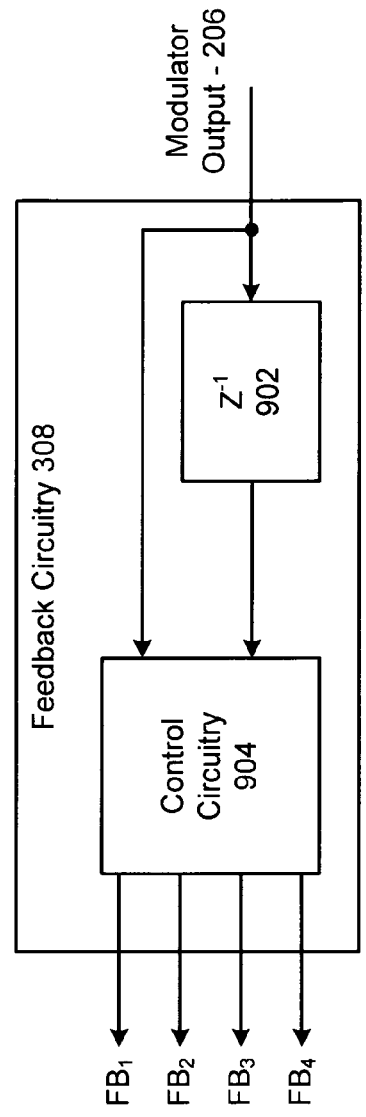
FIG. 9 is a block diagram illustrating feedback circuitry of an ADC constructed according to another embodiment the present invention.

FIG. 9 is a block diagram illustrating feedback circuitry of an ADC constructed according to another embodiment the present invention. Feedback circuitry 308 includes delay element 902 and control circuitry 904. Both delay element 902 and control circuitry 904 receive modulator output 206. Control circuitry 904 further receives a delayed representation of modulator output 206. Feedback circuitry 308 produces feedback signal $FB_1$, $FB_2$, $FB_3$, and $FB_4$. According to one particular operation of the feedback circuitry 308, the feedback signals $FB_1$, $FB_2$, $FB_3$, and $FB_4$, are altered based upon a value of modulator output 206 and whether such modulator output value has changed over six adjacent sampling intervals. The structure of the feedback circuitry 308 could consider a greater or fewer number of adjacent sampling intervals as well. Further, the number of adjacent sampling intervals considered may be alterable by an input control signal.

Figure 10:
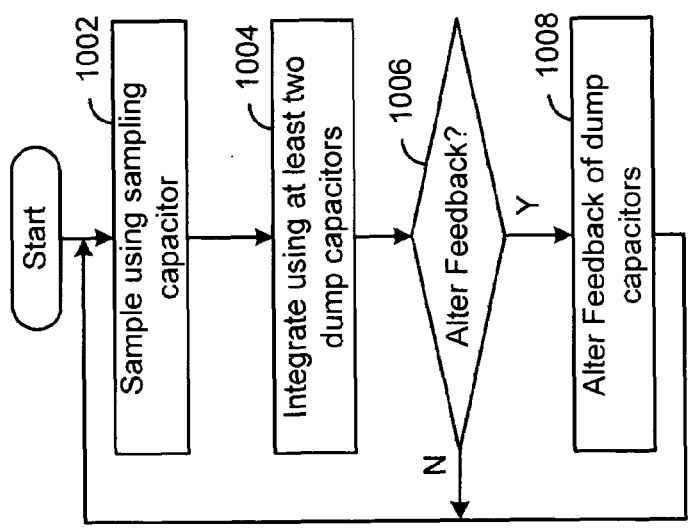
FIG. 10 is a flow chart illustrating a first operation according to an embodiment of the present invention.

FIG. 10 is a flow chart illustrating a first operation according to an embodiment of the present invention. According to this operation, the sampling circuit samples an analog input signal uses sampling capacitors (Step 1002). Then, the sampling circuit integrates the sampled signal using at least two dump capacitors (Step 1004). Based upon the state of a modulator output signal, the feedback circuitry 308 may determine that alteration of feedback signals applied to the dump capacitors is required (Step 1006). If no alteration of the feedback signals is required, operation proceeds to Step 1002. However, if alteration of the feedback signals, e.g., $FB_1$, $FB_2$, $FB_3$, or $FB_4$ is required, the feedback signals provided to dump capacitors by the feedback circuitry 308 is altered (Step 1008). From Step 1008, operation returns to Step 1002. In an embodiment of the present invention, the alteration in step 1008 is implemented by swapping $FB_1$, and $FB_2$.

Figure 11:
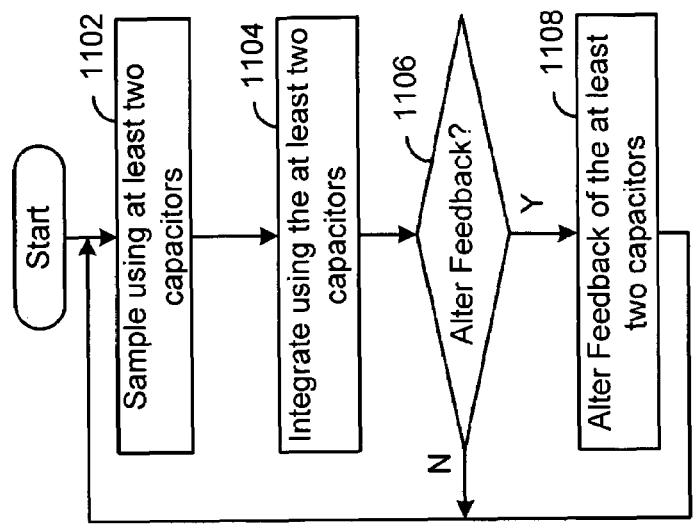
FIG. 11 is a flow chart illustrating operation according to another embodiment of the present invention.

FIG. 11 is a flow chart illustrating operation according to another embodiment of the present invention. The operation of FIG. 11 corresponds to the sampling circuitry 602 illustrated in FIG. 6, for example. Operation of FIG. 11 commences by sampling an analog input signal using at least two capacitors (Step 1102). Operation then includes integrating the sampled signal using the at least two capacitors (Step 1104). Then, the feedback circuitry 308 determines whether alteration of feedback signals to the at least two capacitors is required (Step 1106). If no alteration of the feedback signals is required, operation returns to Step 1102. However, if alteration of the feedback signals is required as determined at Step 1106, the feedback to the at least two capacitors is altered (Step 1108) and operation returns to Step 1102.

The above text and FIGS. 1-11 discuss the invention as single ended, but the concepts disclosed are not limited to single ended designs, and can be applied to differential implementations. The discussion is shown in single ended implementation for clarity only. It should be obvious to one skilled in the art when provided with the disclosure herein that the scope of the patent is intended to cover differential implementations.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (that is, where one element is coupled to another element by inference) includes direct and indirect coupling between two elements in the same manner as "operably coupled." As one of ordinary skill in the art will further appreciate, the term "compares favorably," as may be used herein, indicates that a comparison between two or more elements, items, signals, et cetera, provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal.

As one of average skill in the art will appreciate, other embodiments may be derived from the teaching of the present invention without deviating from the scope of the claims.

What is claimed is:

1. An analog to digital converter comprising:
a modulator operable to receive an analog input signal and to produce a modulator output, the modulator comprising:
a sampling circuit comprising:
a sampling capacitor operable to receive the analog input signal;
first and second dump capacitors, the first dump capacitor operable to receive a first feedback signal and the second dump capacitor operable to receive a second feedback signal;
an integrator operable to receive an output of the sampling circuit and to produce an output;
a quantizer operable to receive the output of the integrator and to produce the modulator output signal; and
feedback circuitry operable to receive the modulator output and to produce the first feedback signal as a function of a current output of the quantizer and the second feedback signal as a function of a prior output of the quantizer; and
a decimation filter operable to receive the quantized output and to produce a digital output signal.

2. The analog to digital converter of claim 1, wherein a sum of the capacitance of the first and second dump capacitors is approximately equal to a capacitance of the sampling capacitor.

3. The analog to digital converter of claim 1, wherein each of the first and second dump capacitors have substantially equal values.

4. The analog to digital converter of claim 1, wherein the quantizer is operable to produce a single bit output.

5. The analog to digital converter of claim 1, further comprising a second sampling circuit including:
a second sampling capacitor operable to receive the analog input signal;
third and fourth dump capacitors, the third dump capacitor operable to receive a third feedback signal and the fourth dump capacitor operable to receive a fourth feedback signal; and
wherein the sampling circuit and the second sampling circuit form a correlated double sampling circuit.

6. The analog to digital converter of claim 5, wherein each of the third and fourth dump capacitors have substantially equal values.

7. The analog to digital converter of claim 1, further comprising a second sampling circuit including:
a second sampling capacitor operable to receive the analog input signal;
third and fourth dump capacitors, the third dump capacitor operable to receive the first feedback signal and the fourth dump capacitor operable to receive the second feedback signal; and
wherein the sampling circuit and the second sampling circuit form a correlated double sampling circuit.

8. The analog to digital converter of claim 7, wherein a sum of the capacitance of the third and fourth dump capacitors approximately equal to a capacitance of the second sampling capacitor.

9. The analog to digital converter of claim 7, wherein each of the third and fourth dump capacitors have substantially equal values.

10. An analog to digital converter comprising:
a modulator operable to receive an analog input signal and to produce a modulator output, the modulator comprising:
a sampling circuit comprising:
a first capacitor having a first side operably coupled to receive the analog input signal during a sampling interval and to receive a first feedback signal during an integrating interval and a second side operably coupled to AC ground during the sampling interval;
a second capacitor having a first side operably coupled to receive the analog input signal during the sampling interval and to receive a second feedback signal during the integrating interval and a second side operably coupled to AC ground during the sampling interval;
an integrator operably coupled to the second side of the first capacitor and to the second side of the second capacitor during the integrating interval;
a quantizer operable to receive the output of the integrator and to produce the modulator output signal; and
feedback circuitry operable to receive the modulator output and to produce the first feedback signal as a function of a current output of the quantizer and the second feedback signal as a function of a prior output of the quantizer; and
a decimation filter operable to receive the quantized output and to produce a digital output signal.

11. The analog to digital converter of claim 10, wherein each of the first and second capacitors have approximately equal capacitance.

12. The analog to digital converter of claim 10, wherein the quantizer is operable to produce a single bit output.

13. The analog to digital converter of claim 10, wherein the feedback circuitry is operable to:
produce the first feedback signal as a function of the current output of the quantizer; and
produce the second feedback signal as a function of the prior output of the quantizer.

14. The analog to digital converter of claim 10, further comprising a second sampling circuit including:
a third capacitor having a first side operably coupled to receive the analog input signal during a second sampling interval and to receive a third feedback signal during a second integrating interval and a second side operably coupled to AC ground during the second sampling interval;

a fourth capacitor having a first side operably coupled to receive the analog input signal during the second sampling interval and to receive a fourth feedback signal during the second integrating interval and a second side operably coupled to AC ground during the second sampling interval; and wherein the sampling circuit and the second sampling circuit form a correlated double sampling circuit.

15. The analog to digital converter of claim 14, wherein each the third and fourth dump capacitors have approximately equal capacitance.

16. The analog to digital converter of claim 14, wherein:
the second sampling interval corresponds to the integrating interval; and
the second integrating interval corresponds to the sampling interval.

17. A method for converting an analog input signal to a digital output signal comprising:
during a sampling interval:
coupling a first side of a sampling capacitor to the analog input signal and a second side of the sampling capacitor to AC ground;
coupling both a first side and a second side of a first dump capacitor to AC ground; and
coupling both a first side and a second side of a second dump capacitor to AC ground;
during an integrating interval:
coupling the first side of the sampling capacitor to AC ground and the second side of the sampling capacitor to an integrator;
coupling the first side of the first dump capacitor to a first feedback signal and the second side of the first dump capacitor to an integrator; and
coupling the first side of the second dump capacitor to a second feedback signal and the second side of the second dump capacitor to the integrator; and
integrating inputs provided to the integrator;
quantizing an output of the integrator to produce a modulator output signal; and
producing the first feedback signal and the second feedback signal based upon the modulator output signal; and
decimation filtering the modulator output signal to produce the digital output signal.

18. The method of claim 17, wherein a sum of the capacitance of the first and second dump capacitors is approximately equal to a capacitance of the sampling capacitor.

19. The method of claim 17, wherein each of the first and second dump capacitors have approximately equal capacitance.

20. A method for converting an analog input signal to a digital output signal comprising:
during a sampling interval:
coupling a first side of a first capacitor to the analog input signal and a second side of the first capacitor to AC ground; and
coupling a first side of a second capacitor to the analog input signal and a second side of the second capacitor to AC ground;
during an integrating interval;
coupling a first side of the first capacitor to a first feedback signal and a second side of the first capacitor to an integrator; and
coupling a first side of the second capacitor to a second feedback signal and a second side of the first capacitor to the integrator;
integrating inputs provided to the integrator,
quantizing an output of the integrator to produce a modulator output signal; and
producing the first feedback signal as a function of a current quantizer output and the second feedback signal as a function of a prior quantizer output; and
decimation filtering the modulator output signal to produce the digital output signal.

21. The method of claim 20, wherein a capacitance of the first capacitor is approximately equal to a capacitance of the second capacitor.

22. A modulator operable to receive an analog input signal and to produce a modulator output signal, the modulator comprising:
a first sampling circuit operable to receive the analog input signal, a first feedback signal, and a second feedback signal and produce a first sampling circuit output;
a first integrator operable to receive the first sampling circuit output and to produce a first integrator output;
a second sampling circuit operable to receive a third feedback signal and the first integrator output and to produce a second sampling circuit output;
a second integrator operable to receive the second sampling it output and a third feedback signal and to produce a second integrator output;
a quantizer operable to receive the second integrator output and to produce the modulator output signal; and
feedback circuitry operable to receive the modulator output signal and to produce the first feedback signal, the second feedback signal, and the third feedback signal.

23. The modulator of claim 22, wherein the first sampling circuit comprises a sampling capacitor operable to receive the analog input signal, a first dump capacitor operable to receive the first feedback signal and a second dump capacitor operable to receive the second feedback signal.

24. The modulator to digital converter of claim 23, wherein a sum of the capacitance of the first and second dump capacitors is approximately equal to a capacitance of the sampling capacitor.

25. The modulator of claim 23, wherein each of the first and second dump capacitors have substantially equal values.

26. The modulator of claim 22, wherein the feedback circuitry is operable to:
produce the first feedback signal as a function of a current output of the quantizer; and
produce the second feedback signal as a function of a prior output of the quantizer.

* * * * *